AUTOMATIC TUNER

Original Filed Aug. 3, 1939 4 Sheets-Sheet 1

Inventors
Bertram A. Schwarz &
Ludwig J. Fechter
By
Willitts, Helwig & Baillio
Attorneys

AUTOMATIC TUNER

Original Filed Aug. 3, 1939 4 Sheets-Sheet 2

Inventors
Bertram A. Schwarz &
Ludwig J. Fichter
By Willitt, Helwig & Baillio
Attorneys

AUTOMATIC TUNER

Original Filed Aug. 3, 1939 4 Sheets-Sheet 3

Inventors
Bertram A. Schwarz &
Ludwig J. Fichter
By
Willis, Helwig & Baillio
Attorneys

AUTOMATIC TUNER

Original Filed Aug. 3, 1939 4 Sheets-Sheet 4

Inventors
Bertram A. Schwarz &
Ludwig J. Fichter
By
Willitt, Helwig & Baillio
Attorneys Reissued Dec. 12, 1950

Re. 23,305

UNITED STATES PATENT OFFICE 23,305

AUTOMATIC TUNER

Bertram A. Schwarz, Kokomo, Ind., and Ludwig J. Fichter, Rockford, Ill., assignors to General Motors Corporation, Detroit, Mich., a corporation of Delaware Original No. 2,342,902, dated February 29, 1944, Serial No. 288,201, August 3, 1939. Application for reissue April 22, 1950, Serial No. 157,618

19 Claims. (Cl. 74—10.39)

Matter enclosed in heavy brackets [ ] appears in the original patent but forms no part of this reissue specification; matter printed in italics indicates the additions made by reissue

This invention relates to automatic indexing means and more specifically to automatic indexing mechanism for automatically tuning a radio communication device.

It has been found that certain persons, particularly children, have difficulty tuning radio receivers accurately and this invention provides push-button operated tuning means which enables one to quickly and accurately tune a radio receiver. This type of mechanism is found to be particularly useful for tuning radio receivers installed on automotive vehicles where the driver must give constant attention to steering as well as all the other duties connected with the safe operation of the vehicle.

Prior devices of this nature have been constructed as accessories to be added to conventional radio receivers which have made them unsightly in appearance and constructed so that they interfere with the operating controls on the automobile due to their size.

One of the objects of the present invention is to provide adjustable automatic indexing control mechanism in which any one of a plurality of radio stations may be sharply tuned by one-way movement of one of a plurality of buttons conveniently located with reference to both the operator and the radio receiver.

Another object of the present invention is to provide a simple but efficient indexing mechanism mounted on part of the housing which encloses it and also the radio receiver so that the complete assembly may be mounted in a small space out of the way of the control mechanism necessary to safe operation of the vehicle.

Another object of our invention is to provide a self-contained illuminating system for indicator mechanism associated with the automatic and conventional tuning control mechanism provided.

A still further object of the invention is to provide automatic mechanism associated with the automatic tuning means which renders the conventional tuning mechanism ineffective when the automatic tuning mechanism is in operation.

These and other objects will be best understood by reference to the following specification and claims, together with the accompanying drawings, in which:

Figure 2:
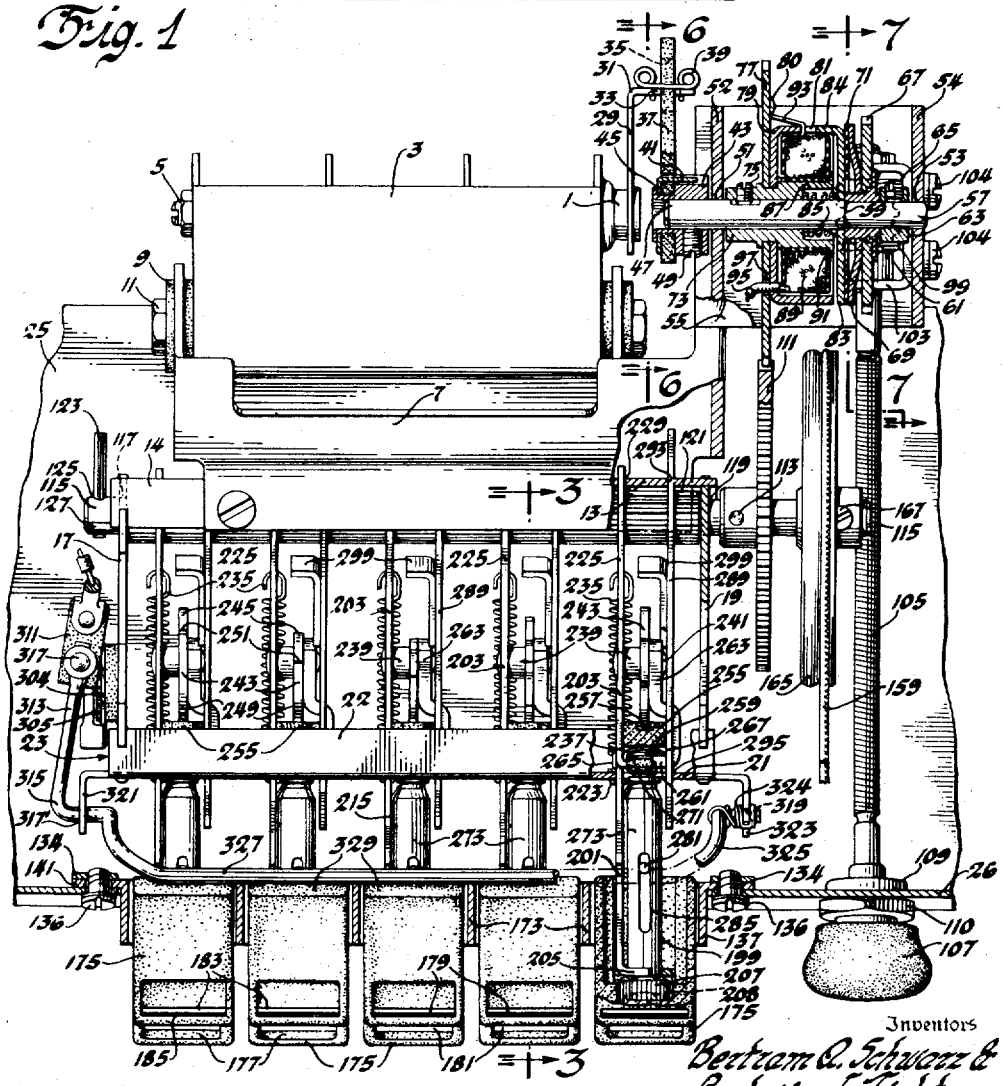
Figure 2 is a top plan view, partly in broken horizontal section, of the control device.

Referring now to Figure 2 of the drawings, a tuning shaft 1 is mounted for rotary movement in thrust bearings, not shown, in a subframe 3. An adjusting screw and locknut indicated at 5 provides a means for adjusting these bearings in the frame 3. Rotary movement of the shaft 1 varies the characteristics of an electrical device in the tuning circuit of a radio communication device by varying either the capacity, inductance or resistance of the circuit.

The subframe 3 is supported on and insulated from a die-cast subframe 7 by three resilient, non-conducting bushings 9 extending through spaced holes in the subframe 7. Cap screws 11 threaded to the ends of the subframe 3 extend through the bushings 9 and serve to compress them slightly so that the frame 3 is insulated both mechanically and electrically from the die-cast frame 7.

Figure 3:
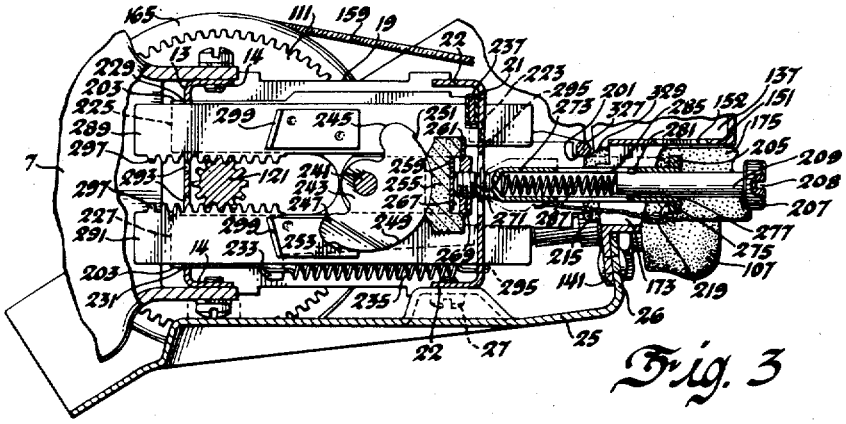
Figure 3 is a side sectional view taken on line 3—3 of Figure 2.

The die-cast frame 7 is fixed to a vertical plate 13 having upper and lower horizontal extensions 14. The plate 13 serves as a back plate to which vertical side plates 17 and 19 are riveted. A vertical front plate 21 having horizontal extensions 22 is riveted to the side plates 17 and 19 to form a rectangular hollow subframe indicated generally at 23 supporting selector mechanism to be referred to later. This subframe 23 on which the frame members 3 and 7 are carried is supported on a pressed metal stamping 25 and is fixed thereto by machine screws 27 extending upwardly through holes in the bottom of the stamping and threaded to the lower horizontal extensions 14 and 22 of the front and back plates 13 and 21 respectively, as best shown in Figure 3. The pressed metal stamping 25 is formed with vertical side portions 24 and a vertical front face 26 and comprises the lower part of a rectangular housing which encloses all the mechanism described above and about to be described together with associated apparatus not included in this application.

The control shaft 1 is driven by means of an insulated coupling device comprising a lever arm 29 riveted to one end of the shaft 1 and extending radially outward therefrom. The end 31 of the lever 29 is bent parallel to the shaft 1 and is reduced in width intermediate its extremities as indicated at 33 and extends through a radial slot 35 in a Micarta lever 37. A helical spring clip 39 placed between the end portion 31 of the lever 29 and the lever 37 exerts a force tending to eliminate lost motion at this point of connection. The inner end of the lever 37 is attached by means of a key 41 to a collar 43 and held thereon by riveting the end 45 of the collar 43. The collar 43 is fixed to the inner end of a clutch shaft 47 by a set screw 49.

The clutch shaft 47 is rotatably mounted in axial alignment with the control shaft 1 in bearings 51 and 53 located in webs 52 and 54 respectively in an extension 55 of the die-cast subframe 7. The shaft 47 is provided with an outer end portion 57 of reduced diameter and a radial flange portion 59 adjacent thereto. A brass collar 61 is supported for rotation on the shaft portion 57 between the flange 59 and a brass thrust collar 63 which is fixed to the end of the shaft portion 57 by a set screw 65. The thrust collar 63 is located on the shaft inside the bearing 53. The collar 61 has a worm wheel 67 and a brass clutch disk 69 fixed thereto and rotatable therewith. The clutch disk 69 is provided with an annular facing 71 of resilient friction material attached to the inner radial face. On the other end of the shaft 47 adjacent the bearing 51 an iron collar 73 is fixed by a set screw 75. This collar has a spur gear 77 and an iron cup-shaped member 79 fixed thereon. The outer annular portion of the cup member 79 is provided with an axial slot 81. A copper-plated iron clutch disk 83 is located on the shaft 47 between the cup member 79 and the clutch disk 69. The disk 83 is provided with an integral tongue 84 bent at right angles to the disk which extends parallel to the shaft and part way into the slot 81 of the cup member so that it is revolved by, but capable of axial displacement with respect to the cup member 79. The clutch disk 83 is constantly urged to the right and into engagement with the disk 69 by a helical spring 85 located concentrically with respect to the shaft 47 in a counterbore 87 of the collar 73.

Disengagement of the clutch disks 69 and 83 is accomplished by the following structure. The annular space between the collar 73, cup 79, and clutch disk 83 contains an annular winding 89 suitably insulated from these members and held on the collar 73 by a turned-up portion 91. One end 93 of this winding is brought out through the slot 81 in the cup 79 and soldered at 80 to the gear 77 which is grounded. The other end 95 of this winding is brought out through aligned holes, indicated at 97, in the gear 77 and cup 79 and is connected to a source of electrical energy by means of a switch which will be described later. By this means it is evident that when the winding 89 is thus energized a magnetic field is set up between cup 79 and disk 83 which will attract the disk and move it to the left against the force of the spring 85 and out of driving engagement with the clutch disk 69.

Figure 9:
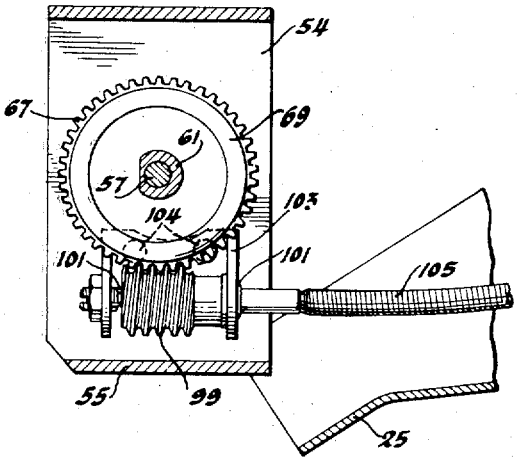
Figure 9 is a side sectional view taken on line 7—7 of Figure 2.

The shaft 47 is driven by the worm wheel 67 when the clutch elements 69 and 83 are engaged. The worm wheel 67 is in mesh with a worm 99 located below it and supported in bearings 101 in a bracket 103 fixed to the web 54 of the extension 55 of the die-cast frame 7 by the machine screws 104 as best shown in Figures 2 and 9. The worm 99 is fixed to one end of a flexible driving shaft 105 for rotation thereby. The other end of the shaft is fixed to a manual control knob 107 supported for rotation in a bushing 109 attached to the front vertical face 26 of the stamping member 25 by a nut 110. Rotation of the knob 107 causes the shaft 47 and control shaft 1 to be rotated when the clutch elements 69 and 83 are in engagement. It will be evident that any other type of reduction gearing having irreversible characteristics may be used in place of the worm wheel 67 driven by the worm 99.

The shaft 47 and control shaft 1 may also be driven by means of the spur gear 77 with the clutch elements 69 and 83 disengaged. The gear 77 meshes with a spur gear 111 having the same number of teeth as the gear 77 and is fixed by means of a pin 113 to the end of a shaft 115. The shaft 115 is supported in bearings 117 and 119 in the side plates 17 and 19 respectively of the selector frame 23, parallel to the control shaft 1 and clutch shaft 47. The shaft 115 is provided with gear teeth intermediate the bearings 117 and 119 and constitutes an elongated pinion portion 121.

Figure 5:
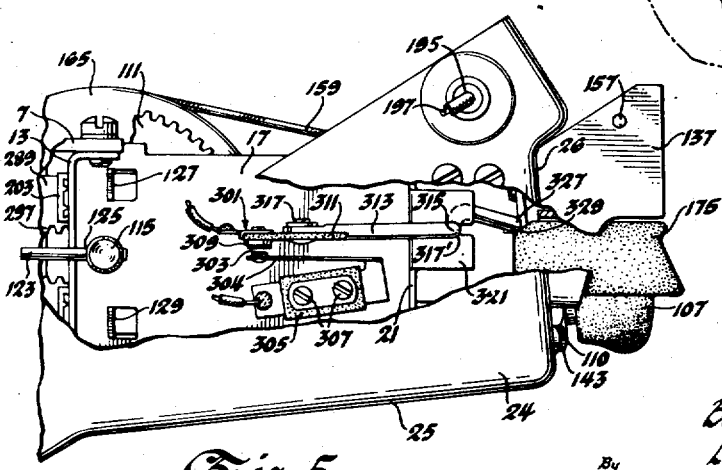
Figure 5 is a side elevational view with parts broken away to show details of the associated electrical control mechanism.

The shaft 115 is limited for movement angularly by a pin 123 pressed in a hole 125 extending diametrically through the end of the shaft 115 which extends through the bearing 117. The end of the pin 123 is arranged to contact abutments 127 and 129 integral with the side plate 17 of the selector frame 23 in either of its extreme angular positions. The abutments 127 and 129 are formed by punching and turning portions of the side plate 17 outward at right angles thereto. The faces of these abutments are parallel to a vertical line extending through the center of the shaft 115 as best shown in Figure 5.

Figure 1:
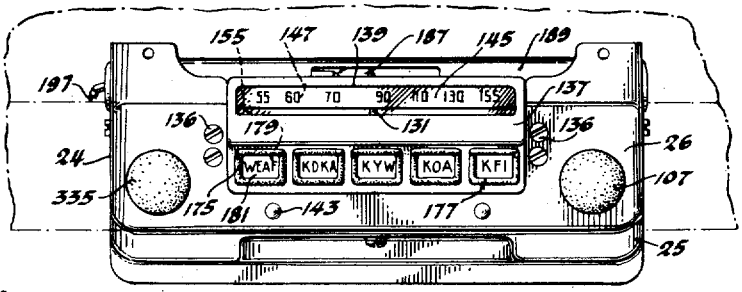
Figure 1 is a front elevation of the control panel of the device.
Figure 6:
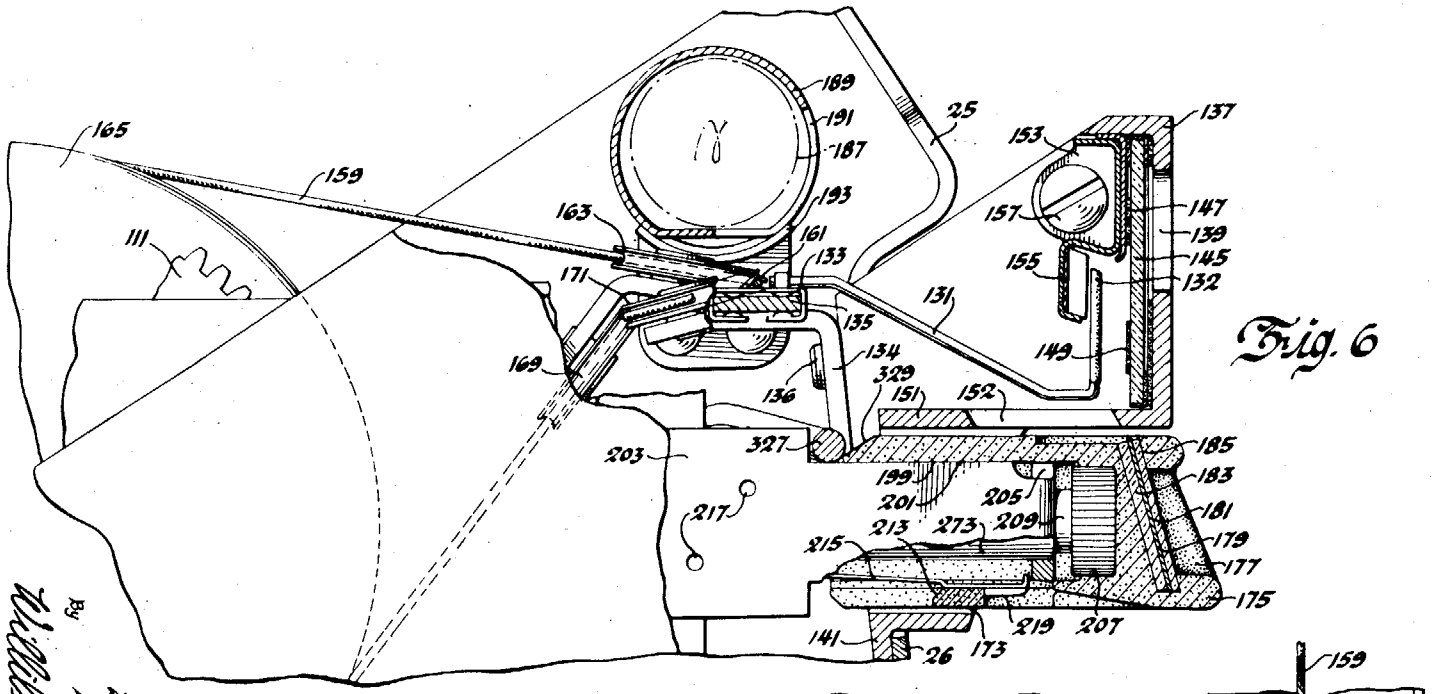
Figure 6 is an enlarged side elevation view similar to Figure 4 with some of the parts broken away further to show additional structural details.
Figure 7:
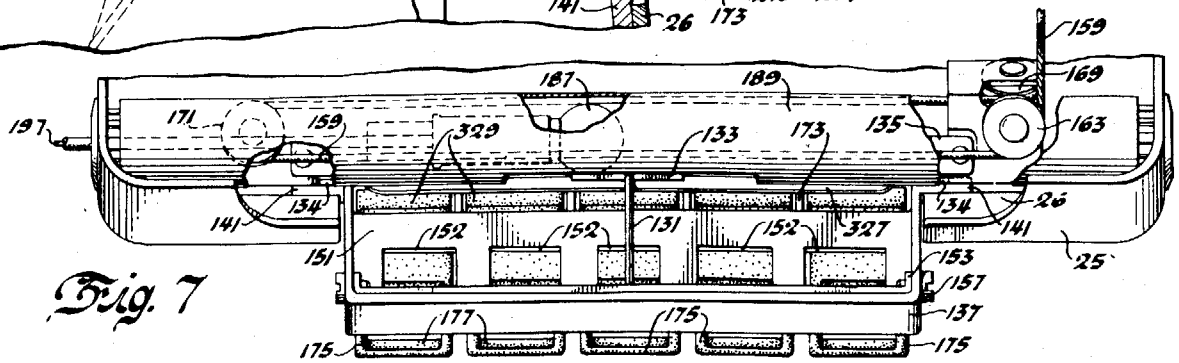
Figure 7 is a top plan view showing the lighting arrangements associated with the device with some of the parts thereof broken away.
Figure 8:
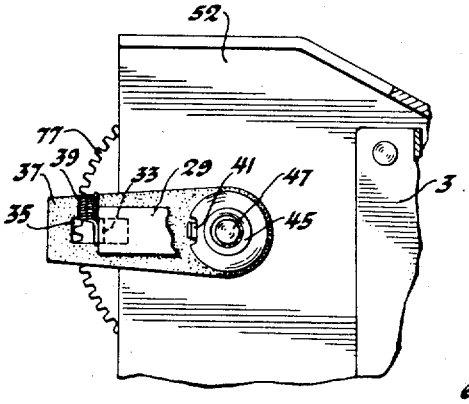
Figure 8 is a side sectional view taken on line 6—6 of Figure 2.

The following mechanism is provided to indicate the angular position of the shafts 1, 47 and 115. A pointer 131 is fixed to a crosshead 133 slidably mounted on a horizontal guide member 135 located adjacent the vertical front face 26 of the metal housing member 25 and fixed thereto by the brackets 134 and machine screws 136 as best shown in Figures 1, 2 and 6. A die-cast member 137, located in an opening in the front face 26 of the housing adjacent to the crosshead and guide members, has a vertical flange 141 through which the machine screws 136 and rivets 143 extend into the face 26 of the housing for holding this die-cast member 137 to the housing 25. The die-cast member is provided with an opening 139 in its front vertical face which is closed by a glass plate 145 having a calibrated scale 147 painted on its back face adjacent the top edge and a painted surface 149 on the back face adjacent the lower edge. The painted surface 149 is located below the lower edge of the opening 139 adjacent a horizontal flange 151 of the housing 137. The glass plate 145 is held in this position by a clamp member 153 provided with a painted front portion 155 and is fixed to the housing 137 by machine screws 157 as best shown in Figure 6. The pointer 131 extends outwardly from the crosshead 133 and passes through the opening between the lower edge of the clamp 153 and the upper surface of the flange 151 and is bent upward so that its end 132 is located between the back surface of the glass 145 and the painted portion 155 on the front surface of the clamp 153. The end 132 of the pointer 131 has its upper extremity located adjacent the lower edge of the scale 147 and is painted white.

The following mechanism is provided to move the crosshead 133 linearly along the guide member 135 so that the position of the pointer end 132 with respect to the scale 147 indicates the angular position of the control shaft 1. A belt 159 is fixed to the crosshead at 161 and extends horizontally from this point, passing over a pulley 163 carried on one end of the guide member 135 and around a driving pulley 165 located adjacent the spur gear 111 and fixed by means of a set screw 167 to the shaft 115. The belt continues around the driving pulley 165 and thence around a pulley 169 located on the guide member 135 directly below and at an angle to the pulley 163 and then horizontally across and around a pulley 171 located on the opposite end of the guide member 135 and then back to the point of attachment 161 on the crosshead 133.

Figure 12:
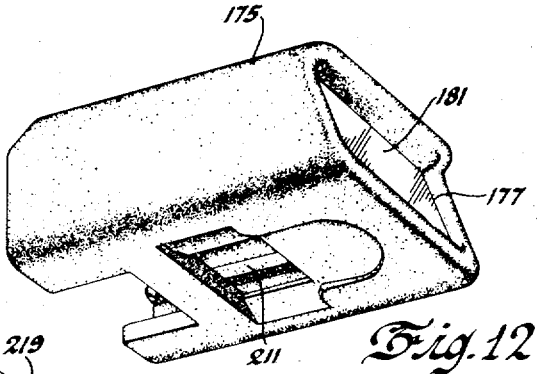
Figures 11 and 12 are perspective views of details of the device.

The die-cast member 137 is provided with a plurality of vertical ribs 173 extending between the horizontal flange 151 below the dial opening 139 and the lower vertical mounting flange 141 dividing this lower portion into five sections (see Figures 1, 2 and 4) in which are located five selector push buttons indicated at 175. These buttons are connected to adjustable mechanisms capable of revolving the shaft 115 in either direction to a plurality of predetermined angular positions which will be described later. The selector buttons 175 are molded of plastic material and are best shown in Figures 1, 6 and 12. In the front face of each an opening 177 is provided through which may be observed broadcasting station identification tags 179. These tags 179 are made of translucent material and these, together with a transparent cover 181 and a Lucite backing strip 183, are located in a substantially vertical slot 185 extending part way down from the upper surface of the button.

The tags 179 and painted scale are indirectly luminated by a miniature incandescent bulb 187 supported in and having one terminal grounded to a metal tube 189. The tube is provided with a central opening 191 in the wall adjacent the back of the die-cast housing 137. The tube 189 is supported in a horizontal position in the housing 25 by brackets 193 fixed to the sides 24 of the housing 25. Bushings extend through openings in the sides 24 of the housing and into the ends of the tube 189. One of these bushings has a central opening 195 through which extends an insulated conductor 197 which is connected to the other terminal of the bulb 187. When this conductor is connected to a source of current the light from the bulb is reflected off the interior surface of the tube 189 which may be painted white and passes out through the opening 191 and falls on the painted surface 149 on the back of the glass 145. Part of this light passes through the glass directly below the painted surface 149. The lower edge and a portion of the front face adjacent thereto of the glass 145 is painted and the light passing through the glass strikes the painted surfaces and by internal reflection illuminates the painted figures of the scale 47. Part of the light rays from the bulb are reflected off the painted strip 149 of the glass and strike the painted front surface 155 of the clamp 153 from which they are reflected onto the painted end 132 of the pointer 131 and the space adjacent thereto, thus illuminating the needle directly and in silhouette. Rays from the bulb also pass through openings 152 in the flange 151 and fall on the upper edges of the Lucite strips 183 in the buttons 175 from which they are internally reflected and thus illuminate the translucent tags 179. The top and bottom edges of the glass 145 and Lucite strips 183 and the back surface of the tags 179 may be painted any given color so that both the figures on the glass and the tags will be illuminated by light of the color selected.

Figure 11:
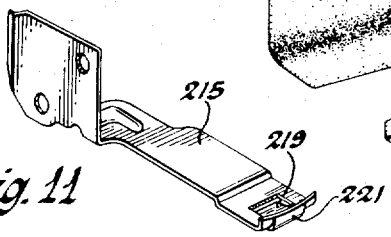

In addition to the manual control knob 107 and connecting means for rotating the control shaft through an arc of substantially 180 degrees, adjustable indexing mechanisms operated by the selector push buttons are provided. These mechanisms provide a means for rotating the control shaft in either direction to a plurality of preselected angular positions. Five such mechanisms are shown which provide a tuning means for a radio communication device so that any one of five wave lengths may be obtained by simply pushing on the proper selector button. Any number of these buttons may be provided and each acts on a separate connecting means made up of identical parts. Any one button in combination with its adjustable connecting means is capable of rotating the shaft 115 in either direction to a plurality of angular positions so that the control shaft 1 geared thereto will assume complementary positions. As all these mechanisms are identical, the following description will be confined to only a single mechanism. Each push button 175 may be inserted in a section of the die-cast housing 137 formed by the horizontal flange 151 and the vertical ribs 173 of the housing located below the dial opening 139. Each button is provided with a recessed portion 199 formed so that it will telescope and fit snugly over the end 201 of a slide bar 203 provided with a right angle end portion 205 and also fit over the knurled head 207 of a locking shaft 209 which will be referred to later. The lower wall of the button 175, as best shown in Figure 12, is provided with a rectangular opening 211 and a beveled surface 213 adjacent thereto (see Figure 6) so that a spring finger 215 (see Figure 11) which is fixed to the slide bar 203 by rivets 217 and provided with a downwardly projecting latch portion 219 and a beveled lip portion 221 adjacent thereto will readily enter the opening 211 in the button when it is pushed on the bar 203 and hold it in the position shown in Figure 4. The button may be easily removed by exerting a slight upward pressure on the portion 219 of the spring finger 215 which extends through the opening 211 in the button 175.

Each slide bar 203 is supported for reciprocal, horizontal movement in the frame 23 by a slotted opening 223 in the front plate 21 through which the end 201 extends. The bar 203 is of increased width adjacent the slot 223 and has a bifurcated end portion comprising an upper leg 225 and a lower leg 227. These legs extend above and below the pinion portion 121 of the shaft 115. Both the upper and lower legs are supported in slots 229 and 231 respectively in the rear plate 13. The lower leg 227 is provided with a downwardly extending hook portion 233 over which one end of a helical tension spring 235 is attached. The other end of the spring is attached to the front plate 21 and by this means the slide bar is urged outward so that an insulated abutment 237, which is formed by bending a portion of the upper extremity of the bar 203 outward at right angles thereto, is held in contact with the front plate 21 as best shown in Figures 2 and 3.

A pin 239 is riveted to the slide bar 203 at a point intermediate the support bearings and extends horizontally and at right angles to the bar. The end 241 of this pin is of reduced diameter and serves as a bearing for a cam 243 rotatably mounted thereon. The cam 243 is provided with two lobes 245 and 247 with an arcuate portion 249 extending therebetween and into the lobe portions to constitute stops 251 and 253. A brake shoe member 255 is provided with a vertical groove 257 having a complementary arcuate surface in contact with the arcuate surface 249 of the cam. The shoe is held in frictional contact on the cam by a leaf spring 259 clamped between the slide bar 203 and the end 261 of a shoe support bar 263 which is riveted at 265 to the slide bar 203. Both the spring 259 and end 261 of the bar 263 extend into a horizontal groove 267 located in the shoe 255 to prevent the shoe from turning with the cam. The other end of the shoe support bar is riveted to the end 241 of the cam support pin 239 (see Figures 2 and 3). The end 261 of the bar is provided with a threaded opening 269 through which the threaded end 271 of a hollow sleeve 273 extends and bears on the portion of the spring 259 in contact with the shoe 255 as shown best in Figure 3. This structure provides a means for locking the cam in any desired angular position with respect to the slide bar.

Figure 4:
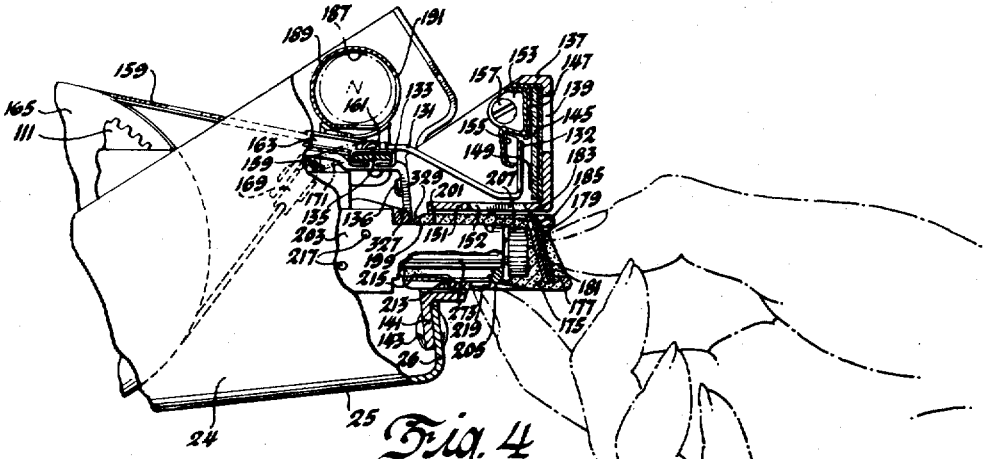
Figure 4 is a side elevational view with some of the parts shown in vertical section and others broken away to show certain structural details.

The other end of the sleeve 273 is supported for rotation in a drilled hole 275 in the right angle end portion 205 of the slide bar (see Figure 4). Rotation of the sleeve for locking the cam is accomplished by the locking shaft 209 having a knurled head 207, both of which have been previously referred to. The locking shaft 209 is supported for axial movement in the bore 277 of the hollow sleeve and is prevented from turning with respect thereto by a pin 281 pressed into a diametral hole near the inner end of the shaft 209. The ends of the pin 281 extend radially outward from the shaft and are supported for axial movement in axial slots 285 located diametrically opposite each other in the wall of the sleeve. A throat 208 is provided in the front face of the knurled head 207 so that the sleeve may be tightened with a screw driver to lock the cam tightly. A helical compression spring 287 is located in the bore 277 of the sleeve which tends to urge the shaft outward and serves to project the push button off the slide bar 203. The knurled head 207 is moved outward with respect to the sleeve 273 by the spring 287 so that it may be grasped by the hand for locking or unlocking the cam.

Located adjacent each slide bar 203 is an upper rack bar 289 and a lower rack bar 291. These bars are supported for horizontal reciprocal movement in slots 293 in the back plate 13 and slots 295 in the front plate 21 adjacent the slots 223, 229 and 231 supporting the slide bar 203. Both of these rack bars are provided with a rack portion 297 meshing with the pinion portion 121 of the shaft 115 at diametrically opposite points on its periphery. Each bar is provided with an abutment 299 spot-welded thereon and so located with respect to the slide bar that they will be contacted by the lobes 245 and 247 of the cam carried thereon when it moves inwardly. Movement of the racks by the cam causes rotation of the shaft 115 in a direction depending upon the position of the abutments with respect to the cam and angular position of the cam with respect to the slide bar 203.

When the control shaft is to be rotated by the selector means, it is necessary to disconnect the clutch elements 69 and 83 which allows the shaft 47 to rotate with respect to the worm wheel 67. In order to do this the winding 89 must be connected to a source of current by an electrical switch indicated generally at 301 (see Figure 5). This switch consists of a contact 303 fixed to a spring member 304 clamped between insulated members 305 and held on the side plate 17 by machine screws 307. Another contact 309 is riveted to an insulation strip 311 which is attached to the bent end 313 of a rod 315 by a rivet 317. The rod 315 is supported for rotation in alignment holes 317 and 319 in the angular extensions 321 and 323 respectively on either end of the front plate 21 of the selector frame 23 as shown in Figures 2 and 5. A helical torsion spring 324 located on the opposite rod end 325 and having one end hooked over the rod end and the other hooked over the extension 323, serves to normally hold the contact 309 in a spaced angular relation with respect to the contact 303 and maintain the straight portion 327 of the rod in contact with the beveled portions 329 formed on the inner end of the upper surface of the push buttons 175. The beveled portions 329 act as cams and initial inward movement of any push button lifts the portion 327 of the rod and causes the switch contacts 303 and 309 to be closed.

Figure 10:
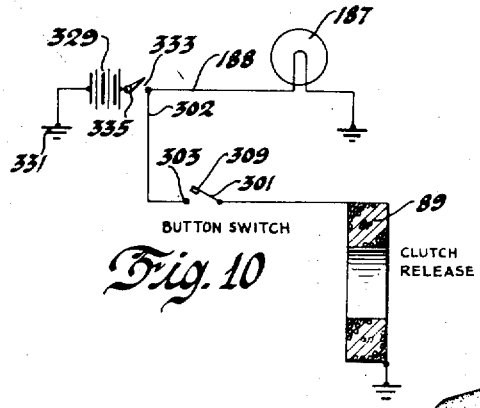
Figure 10 is a schematic wiring diagram showing the circuit connections between the electrical devices associated with the control device.

The various electrical devices and control associated with the complete device are connected as shown in Figure 10 in which 329 is a battery, one side of which is grounded at 331 and the other side connected to a switch 333. This switch may be operated by a volume control knob 335 located on the housing member, as shown in Figure 1, and is connected to the light 187 and switch 301 by the conductors 188 and 302 respectively.

The operation of the device is as follows: The switch 333, when closed by turning the volume control knob 335 from the off position, establishes a circuit to ground through the indicator light bulb 187 and connects the contact of the switch 301 to the battery 329. Turning the tuning control knob 107 revolves the control shaft 1 by means of the worm 99, worm wheel 67 and clutch elements 69 and 83. The shaft 115 is revolved by the gears 77 and 111 and the upper and lower rack bars 289 and 291 meshing with the shaft pinion portion 121 are moved linearly in opposite directions. The indicating needle 131 is likewise moved by the belt 159 driven by the pulley 165 fixed to the shaft 115 until a broadcasting station is received and identified by the reading on the scale 147 adjacent the needle end 132. In order to cause the control shaft 1 to be moved to this position by any one of the selector buttons 175, the following adjustments are made.

With the receiving set tuned to any identified station desired, any push button 175 is removed which allows the knurled head 207 to be moved outwardly by the spring 287 so that it may be turned to the left by hand or by a screw driver inserted in the throat 208 therein to unlock the cam 243. The slide bar 203 is pushed inwardly until the upper and lower lobes of the cam contact both of the abutments 299 on the rack bars 289 and 291 which causes it to assume an angular position with respect to the slide bar, depending upon the relative positions of the rack bars. The cam may be locked in this position by a screw driver while the slide bar is in its innermost position or by turning the knurled head upon the return of the slide bar and head to their normal outward positions. With the push button removed no movement of the rod portion 327 occurs when the slide bar is moved inwardly and the switch 301 which is actuated by this rod remains open which prevents disengagement of the clutch elements 69 and 83. The shaft 115 will be accordingly prevented from rotating by its geared connection with the tuning shaft which is held stationary by the engaged clutch elements and the worm gearing associated therewith while the cam is being set. This setting procedure is repeated for each slide bar cam and the removable identification tags may be lettered with the station call letters which the receiver will be tuned to upon subsequent inward movement of the individual slide bars.

The shaft 115 is moved to any one of these five positions by the cams in the following manner. Referring to Figure 3, it will be observed that if the slide bar 203 is moved inwardly a slight amount, the rod portion 327 will be raised by the beveled portion 329 on the upper inner edge of the button. This movement rocks the rod end 313 to close the contacts of the switch 301 and energizes the coil 89 which disengages the clutch elements 69 and 83, rendering the control knob 107 ineffective for rotating the shaft 47. The control shaft 1 may now be moved by its connection to the shaft 47 which is rotated by the gear 77 meshing with the gear 111 fixed to the shaft 115. Rotation of these parts is resisted by the residual drag between the disengaged clutch elements, inherent friction of the moving parts and the restraint on the control shaft which may be varied by the end thrust adjusting means 5 located on one end of the shaft 1.

Referring to Figure 3, it will be observed that when the slide bar 203 is moved toward the shaft 115, the cam lobe 247 contacts the abutment 299 on the lower rack bar 291 moving it inward. The shaft 115 will be rotated clockwise by the rack bar until the upper cam lobe 245 contacts the abutment 299 on the upper rack bar 289. When this occurs the movement of the shaft rack bars and slide bar ceases. The shafts 115 and 1 are retained in this position by bearing friction and the slide bar is returned to its original position by the spring 235. The switch 301 is opened when this takes place and the clutch elements are reengaged by the spring 85.

With this selector mechanism the control shaft 1 may be rotated in either direction to one of a plurality of angular positions and each mechanism may be adjusted to change any of these positions by unlocking the cam carried on the slide bar and tuning another station by means of the control knob. This changes the angular position of the shaft 115 and the cam may be moved with reference to the slide bar by pushing the bar inward. The cam is then locked and the shaft will be moved to this new position whenever the slide bar is pushed in.

We claim:

1. In an automatic indexing and tuning mechanism for radio communication devices comprising, a control shaft, reciprocable means operatively connected to the control shaft, actuating means for said reciprocable means to rotate said control shaft in either direction to a predetermined angular position, rotatable means for rotating said control shaft to any one of a plurality of angular positions, clutch means normally connecting said rotatable means to said control shaft and means for disconnecting said clutch means, said last named means including control means engageable by and operable by said actuating means.

2. In an automatic indexing and tuning mechanism for radio communication devices comprising, a control shaft, reciprocable means operatively connected to said control shaft, reciprocable actuating means for said reciprocable means to rotate said control shaft in either direction to a predetermined angular position, rotatable means for rotating said control shaft in either direction to any one of a plurality of angular positions, clutch means normally connecting said rotatable means to said control shaft and means for disconnecting said clutch means, said last named means including control means engageable by and operable by said reciprocable actuating means.

3. In an automatic indexing and tuning mechanism for radio communication devices comprising, a control shaft, reciprocable means operatively connected to said control shaft, reciprocable actuating means for said reciprocable means movable in one direction to rotate said control shaft in either direction to a predetermined angular position, means normally biasing said actuating means to its inoperative position, rotatable means for rotating said control shaft to any one of a plurality of angular positions, said rotatable means having irreversible characteristics, clutch means normally connecting said rotatable means to said control shaft and means for disconnecting said clutch means, said last named means including control means engageable by and operable by movement of said reciprocable actuating means from its inoperative position.

4. In an automatic indexing and tuning mechanism for radio communication devices comprising, a control shaft, reciprocable means operatively connected to said control shaft, reciprocable actuating means for said reciprocable means including adjustable means for contacting said reciprocable means whereby said control shaft may be rotated to any one of a plurality of predetermined angular positions, rotatable means for rotating the control shaft in either direction and holding said shaft in any one of a plurality of angular positions, clutch means normally connecting said rotatable means to said control shaft and means for disconnecting said clutch means, said last named means including switching means engageable by and controlled by said reciprocable actuating means.

5. In an automatic indexing and tuning mechanism for radio communication devices comprising, a control shaft, reciprocable means operatively connected to said control shaft, reciprocable actuating means for said reciprocable means to rotate said control shaft to any one of a plurality of predetermined angular positions, said actuating means including a member angularly adjustable with respect thereto adapted to be moved thereby into contact with said reciprocable means, locking means for said member, removable means adapted to be supported on said actuating means and resilient means for retaining said removable means thereon, rotatable means for rotating said control shaft in either direction to any one of a plurality of angular positions, a clutch normally connecting said control shaft to said rotatable means, and means for disconnecting said clutch, said means including switching means engageable by said removable means and controlled by initial movement thereof when retained on said reciprocable actuating means.

6. In an automatic indexing and tuning mechanism for radio communication devices comprising, a control shaft, reciprocable means operatively connected to said control shaft, reciprocable actuating means for said reciprocable means to rotate said control shaft to any one of a plurality of predetermined angular positions, said actuating means including an angularly adjustable member adapted to contact said reciprocable means, telescopic means for locking said angularly adjustable member in any one of a plurality of angular positions on said actuating means, said telescopic means normally biased to project beyond said actuating means, a removable push button adapted to be supported on said actuating means, resilient means retaining said push button thereon and depressible to release said push button therefrom, said push button when retained on said actuating means serving to enclose and hold said telescopic locking means retracted, rotatable means for rotating said control shaft in either direction to any one of a plurality of angular positions, clutch means normally connecting said control shaft with said rotatable means, means for disconnecting said clutch means and control means for said last named means engageable by said push button and controlled by initial movement thereof when retained on said actuating means.

7. In an automatic indexing and tuning mechanism for radio communication devices comprising, a control shaft, reciprocable means operatively connected to said control shaft, actuating means for said reciprocable means to rotate said shaft in either direction to a predetermined angular position, said means including removable means and manually operable retaining means therefor to release said removable means, rotatable means for rotating said control shaft in either direction to any one of a plurality of positions, a clutch normally connecting said control shaft to said rotatable means and including an electromagnetic winding adapted when energized to disconnect said clutch and a control switch connected electrically to said electromagnetic winding to control the energization thereof, said switch actuated by said removable means when retained on and initially moved by said actuating means.

8. In an automatic indexing and tuning mechanism for radio communication devices comprising, a control shaft, a plurality of motion transmitting means operatively connected to said shaft, actuating means for each of said motion transmitting means, each of said actuating means being radially movable with respect to said shaft and comprising adjustable means capable of being moved into contact with one of said motion transmitting means to rotate said control shaft in either direction to any one of a plurality of preselected angular positions, telescopic locking means for said adjustable means including biasing means to extend said locking means for manual operation thereof, a removable button mounted on said actuating means to enclose and hold said telescopic locking means collapsed and manually releasable retaining means for retaining said button on said actuating means, a member supporting all the above apparatus provided with an aperture through which all of said buttons project for manual operation of each actuating means and the locking means associated therewith.

9. In an automatic indexing and tuning mechanism for radio communication devices comprising, a control shaft, a plurality of motion transmitting means operatively connected to the control shaft, actuating means for each of said motion transmitting means movable at right angles with respect to said control shaft, each of said actuating means comprising adjustable means capable of movement into contact with one of said motion transmitting means to rotate said control shaft in either direction to any one of a plurality of preselected angular positions, telescopic locking means for said adjustable means including biasing means to extend said telescopic means for manual operation thereof, a removable push button mounted on said actuating means for manual operation thereof, manually releasable retaining means for retaining said button on said actuating means, said push button when so retained enclosing and holding said telescopic locking means in a collapsed position and biasing means for said actuating means normally holding said adjustable means out of contact with said associated motion transmitting means, means for rotating said tuning shaft in either direction and holding said shaft in any one of a plurality of angular positions including an actuating knob, and a clutch normally connecting said control shaft with said rotatable means, said clutch including an electromagnet adapted when energized to disconnect said clutch, switch means electrically connected to said electromagnet for controlling the energization thereof, actuating means for said switch operable by any one of said push buttons when retained on its actuating mechanism, and a housing member supporting all of the above apparatus having apertures through which each of said buttons and said knob projects for manual operation.

10. In electrical apparatus comprising a movable tuning unit, in combination, a driving member for moving said tuning unit, connecting means for coupling said member to said tuning unit, means for indicating the relative position of said tuning unit, connecting means for coupling said indicating means to said driving member, manual means for moving said driving member, *friction* clutch means for coupling said manual means to said driving member for manual operation, and release means operating on said clutch means for uncoupling the said manual means from said driving member, and means operable while said manual means is uncoupled for moving said driving member to a predetermined setting.

11. In a device as per claim 10 in which said means operable when said manual means is uncoupled comprises a rotatable member coupled to said driving member and a plurality of plunger-operated cams, each adapted to rotate said rotatable member over a predetermined adjustable angle of rotation.

12. In a radio control device, a rotatable control shaft, a plurality of longitudinally movable driving and stopping means operably connected to the shaft, means projecting from each longitudinally movable means at an intermediate point in its length and a second longitudinally movable means engaging the projecting means to cause the driving and stopping means to move and rotate the shaft in either direction to a predetermined angular position.

13. In a radio control device, a rotatable control shaft, a plurality of longitudinally movable driving and stopping means operably connected to the shaft, means projecting from each longitudinally movable means at an intermediate point in its length, and a plurality of further longitudinally movable means each engaging a pair of the first-named longitudinally movable means to individually rotate the shaft to different predetermined angular positions.

*14. In an automatic indexing means for a radio receiver, means for tuning said receiver over a predetermined band of frequencies, movable means operatively connected to said tuning means to move the same, manually adjustable means, friction clutch means interposed between the manually adjustable means and the movable means connected to the tuning means to provide for coupling and uncoupling said manually adjustable means and said movable means, means for indicating the relative position of said tuning means, connecting means for coupling said indicating means to said movable means, longitudinally movable means arranged to engage the movable means operatively connected to the tuning means to independently move the latter, clutch actuating means, and means including means carried by the longitudinally movable means, for effecting actuation of the clutch actuating means to actuate the clutch upon movement of the longitudinally movable means to disengage the manually adjustable means during operation of the longitudinally movable means.*

*15. In an automatic indexing means for a radio receiver, means for tuning said receiver over a predetermined band of frequencies, movable means operatively connected to said tuning means to move the same, manually adjustable means, clutch means interposed between the manually adjustable means and the movable means connected to the tuning means to provide for coupling and uncoupling said manually adjustable means and said movable means, means for indicating the relative position of said tuning means, connecting means for coupling said indicating means to said movable means, longitudinally movable means arranged to engage the movable means operatively connected to the tuning means to independently move the latter, clutch actuating means, and means including means carried by the longitudinally movable means, for effecting actuation of the clutch actuating means to actuate the clutch upon movement of the longitudinally movable means to disengage the manually adjustable means during operation of the longitudinally movable means, said means carried by the longitudinally movable means being movable with respect to the longitudinally movable means so that it can be moved away from actuating position as desired.*

*16. In an automatic indexing means for a radio receiver, means for tuning said receiver over a predetermined band of frequencies, rotatable means operatively connected to the tuning means to drive the same, a plurality of independent reciprocable members operatively associated with said rotatable means to rotate the same in either direction to a predetermined angular position upon relative motion with respect thereto, means for indicating the relative position of said tuning means, connecting means for coupling said indicating means to said tuning means, manually rotatable means to drive the rotatable means, friction clutch means coupling and uncoupling said manually rotatable means and said rotatable means, clutch actuating means, and means including means on each of the reciprocable members, for effecting actuation of the clutch actuating means to actuate the clutch upon reciprocatory movement of any one of the members to disengage the manually rotatable means during operation of any of the reciprocating members.*

*17. In an automatic indexing means for a radio receiver, means for tuning said receiver over a predetermined band of frequencies, rotatable means operatively connected to the tuning means to drive the same, a plurality of independent reciprocable members operatively associated with said rotatable means to rotate the same in either direction to a predetermined angular position upon relative motion with respect thereto, means for indicating the relative position of said tuning means, connecting means for coupling said indicating means to said tuning means, manually rotatable means to drive the rotatable means, clutch means coupling and uncoupling said manually rotatable means and said rotatable means, clutch actuating means, and means, including means on each of the reciprocable members, for effecting actuation of the clutch actuating means to actuate the clutch upon reciprocatory movement of any one of the members to disengage the manually rotatable means during operation of any of the reciprocating members, each of the means on each reciprocable member being movable away from operative position with respect to its reciprocable member to disable it from clutch actuation as desired.*

*18. In an automatic indexing means for a radio receiver, means for tuning said receiver over a predetermined band of frequencies, movable means operatively connected to said tuning means to move the same, manually adjustable means, clutch means interposed between the manually adjustable means and the movable means interconnecting the two in driving relation but permitting uncoupling, means for indicating the relative position of said tuning means, connecting means for coupling said indicating means to said movable means, a plurality of independent reciprocable members, an adjustable cam member carried by each reciprocable member adapted to engage parts of said movable means to move the latter to different predetermined positions depending upon the setting of the cam, means carried by each reciprocating member to lock its cam in a desired position, clutch actuating means, and means, including means carried by each reciprocable member, for effecting actuation of the clutch actuating means upon movement of the reciprocable means toward said movable member.*

*19. In an automatic indexing means for a radio receiver, means for tuning said receiver over a predetermined band of frequencies, movable means operatively connected to said tuning means to move the same, manually adjustable means, clutch means interposed between the manually adjustable means and the movable means interconnecting the two in driving relation but permitting uncoupling, means for indicating the relative position of said tuning means, connecting means for coupling said indicating means to said movable means, a plurality of independent reciprocable members, an adjustable*

*cam member carried by each reciprocable member adapted to engage parts of said movable means to move the latter to different predetermined positions depending upon the setting of the cam, means carried by each reciprocating member to lock its cam in a desired position, clutch actuating means, and means, including means carried by each reciprocable member, for effecting actuation of the clutch actuating means upon movement of the reciprocable means toward said movable member, said last named means on each reciprocable member being movable away from actuating position with respect to the reciprocable member to permit resetting of said cam means without causing actuation of the clutch means.*

BERTRAM A. SCHWARZ.
LUDWIG J. FICHTER.

No references cited.